(12) United States Patent
Chen et al.

(10) Patent No.: US 10,164,560 B2
(45) Date of Patent: Dec. 25, 2018

(54) METHOD FOR CREATING SWITCH RELUCTANCE MOTOR MEMORY SENSOR MODEL

(71) Applicant: China University of Mining and Technology, Xuzhou, Jiangsu (CN)

(72) Inventors: Hao Chen, Xuzhou (CN); Yan Liang, Xuzhou (CN)

(73) Assignee: China University of Mining and Technology, Xuzhou, Jiangsu (CN)

( * ) Notice: Subject to any disclaimer, the term of this patent is extended or adjusted under 35 U.S.C. 154(b) by 339 days.

(21) Appl. No.: 14/762,298

(22) PCT Filed: Apr. 19, 2013

(86) PCT No.: PCT/CN2013/074453
§ 371 (c)(1),
(2) Date: Jul. 21, 2015

(87) PCT Pub. No.: WO2014/117441
PCT Pub. Date: Aug. 7, 2014

(65) Prior Publication Data
US 2015/0363529 A1    Dec. 17, 2015

(30) Foreign Application Priority Data

Jan. 29, 2013   (CN) .......................... 2013 1 0033182

(51) Int. Cl.
*H02P 25/08*        (2016.01)
*G06F 17/50*        (2006.01)

(52) U.S. Cl.
CPC .......... *H02P 25/08* (2013.01); *G06F 17/5036* (2013.01); *Y02T 10/82* (2013.01)

(58) Field of Classification Search
CPC ....... G06F 17/5036; H02P 25/08; Y02T 10/82
USPC ...................................... 318/254.1
See application file for complete search history.

(56) References Cited

PUBLICATIONS

Biolek, Dalibor, et al. "Mutators for transforming nonlinear resistor into memristor." Circuit Theory and Design (ECCTD), 2011 20th European Conference on. IEEE, 2011. pp. 488-491.*
Biolek, Dalibor, Viera Biolková, and Zdeněk Kolka. "Low-voltage-low-power current conveyor for battery supplied memristor emulator." Proc. of 5th International Conference on Circuits, Systems and Signals (CSS'11), Corfu, Greece. 2011. pp. 171-175.*

(Continued)

*Primary Examiner* — Kamini S Shah
*Assistant Examiner* — John E Johansen
(74) *Attorney, Agent, or Firm* — Saliwanchik, Lloyd & Eisenschenk

(57) ABSTRACT

A method for creating a switch reluctance motor memory sensor model. A switch reluctance motor memory sensor circuit model is formed by two current transmitters AD844, an operational amplifier AD826, a memristor, a capacitor, and three resistors. The method for creating a switch reluctance motor memory sensor model enables physical phenomena in a simulation system to be similar to an actual switch reluctance motor system, and is beneficial for direct mathematical simulation of a switch reluctance motor system. The method is simple, can improve static and dynamic performance of a system, and achieves real-time simulation and real-time control of the switch reluctance motor system.

1 Claim, 1 Drawing Sheet

(56) References Cited

PUBLICATIONS

Biolek, Dalibor et al., "Mutators simulating memcapacitors and meminductors," *IEEE Asia Pacific Conference*, 2010, p. 800-803.
Di Ventra, Massimiliano et al., "Circuit Elements With Memory: Memristors, Memcapacitors, and Meminductors," *Proceedings of the IEEE*, 2009, 97(10):1717-1724.
Zhang, Jincheng et al., "Meminductor Modeling Based on Matlab and Applications," *Research & Progress of SSE*, 2012, 32(3):Abstract.

* cited by examiner

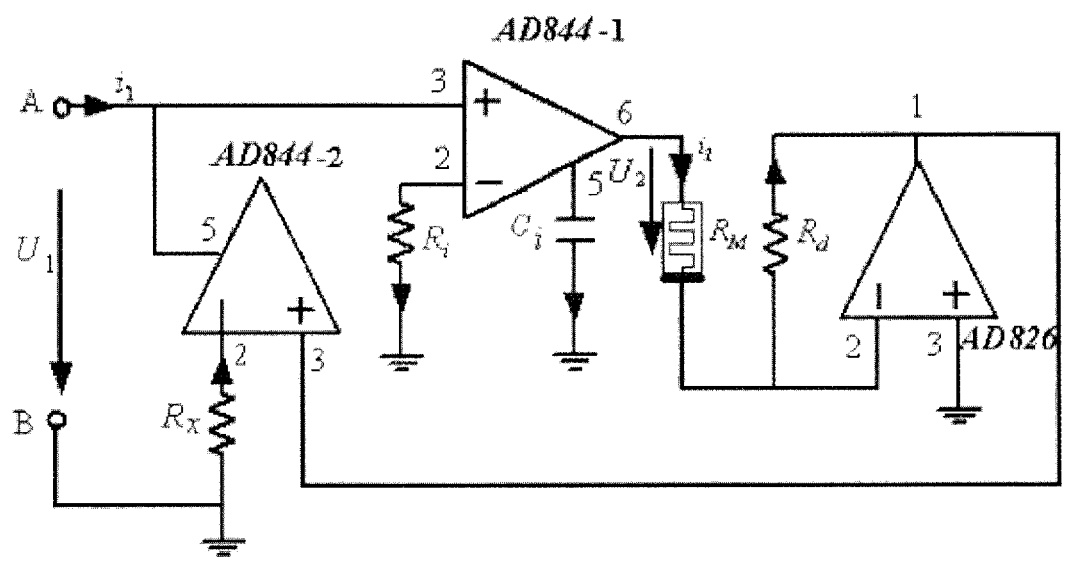

METHOD FOR CREATING SWITCH RELUCTANCE MOTOR MEMORY SENSOR MODEL

CROSS REFERENCE TO A RELATED APPLICATION

This application is a National Stage Application of International Application Number PCT/CN2013/074453, filed Apr. 19, 2013; which claims priority to Chinese Application No. 201310033182.8, filed Jan. 29, 2013; both of which are incorporated herein by reference in their entirety.

I. TECHNICAL FIELD

The present invention relates to a modelling method for a switch reluctance motor memory sensor model, which is especially suitable for switch reluctance motors with different phases.

II. BACKGROUND ART

A linear model of the switch reluctance motor ignores nonlinear factors such as magnetic saturation, such that the phase inductance of the switch reluctance motor is only associated with the positional angle of the rotor thereof, but not with the magnitude of phase current. Therefore, the linear model of the switch reluctance motor results in a big error in the optimization design, the quantitative analysis of the static and dynamic performance, the evaluation of control strategy and the like of the motor. As the switch reluctance motor itself has local magnetic saturation and a nonlinear magnetic circuit, and the power converter thereof is in a switch mode and has a nonlinear circuit topology, the phase inductance of the switch reluctance motor has a nonlinear property, which is not only associated with the positional angle of the rotor thereof, but also with the magnitude of phase current. Creating an accurate nonlinear model for the switch reluctance motor facilitates to increase the accuracy for the optimization design, the quantitative analysis of the static and dynamic performance, the evaluation of control strategy and the like of the motor. Phase inductance nonlinear modelling of the switch reluctance motor is the key for creating an accurate nonlinear model for the switch reluctance motor, however, it is difficult to utilize a traditional modelling method for a motor in the modelling of a switch reluctance motor. Phase inductance digitize nonlinear modelling for the switch reluctance motor requires a simulator and a controller to have great computing power in simulation and actual control, causing a conflict between operation cost and instantaneity of a system. Direct mathematical simulation enables physical phenomena in a simulation system to be similar to an actual system. The memory sensor is controlled by a magnetic linkage, is provided with a magnetic linkage-current hysteresis loop and is able to simulate the nonlinear relation between the phase inductance of the switch reluctance motor and the positional angle of the rotor and the magnitude of the phase current thereof. Creating a memory sensor model for the switch reluctance motor by using a hardware circuit is a direct mathematical simulation. This modelling method lays a foundation for circuit hardware modelling of the switch reluctance motor system model, and is beneficial for realizing direct mathematical simulation of a switch reluctance motor system and enables physical phenomena in the simulation system to be similar to an actual switch reluctance motor system.

III. CONTENTS OF THE INVENTION

The object of the present invention is to provide a linear modelling method for a memory resistor of a switch reluctance motor to overcome existing problems in prior art, which is simple and is able to improve the dynamic and static performance of a system and to enable the real-time simulation and real-time control of a switch reluctance motor system.

The modelling method for a memory sensor model of a switch reluctance motor in the present invention is as follows:

a) two current conveyors AD844, an operational amplifier AD826 and a memory resistor are utilized, wherein the terminal voltage of the input ports A-B of the memory sensor is $U_1$, and the current flowing into the memory sensor from the input port A thereof is $i_1$;

b) the input port A of the memory sensor is connected with an in-phase input port of the current conveyor AD844-1 that is in turn connected with a port of the current conveyor AD844-2; an out-phase input port of the current conveyor AD844-1 is connected with one end of a resistor $R_i$, the other end of which is connected with the ground; the port of the current conveyor AD844-1 is connected with one end of a capacitor $C_i$, the other end of which is connected with the ground; the out-phase input port of the current conveyor AD844-2 is connected with one end of a resistor $R_x$, the other end of which is connected with the ground; the input port B of the memory sensor is connected with the ground; the output port of the current conveyor AD844-1 is connected with one end of a memory resistor $R_M$, the other end of which is connected with the out-phase input port of the operational amplifier AD826; $U_2$ is a voltage drop on the memory resistor, $i_2$ is a current in the memory resistor; the out-phase input port of the operational amplifier AD826 is also connected with one end of a resistor $R_d$, the other end of which is connected with an output port of the operational amplifier AD826; the output port of the operational amplifier AD826 is also connected with an in-phase input port of the current conveyor AD844-2; and the in-phase input port of the operational amplifier AD826 is connected with the ground;

a memory sensor circuit model is obtained at the input ports A-B of the memory sensor, and the equivalent inductance L thereof is expressed as:

$$L = C_i R_i R_M \frac{R_x}{R_d}$$

Benefits: There are following beneficial effects: the present invention creates a memory sensor model for the switch reluctance motor by using a hardware circuit, which is direct mathematical simulation, enables physical phenomena in a simulation system to be similar to an actual switch reluctance motor system, and has low hardware cost and strong instantaneity for simulation and actual control; it is based on a passive two-end element of a memory resistor $R_M$, such that the phase inductance of the switch reluctance motor has a nonlinear property, which is not only associated with the positional angle of the rotor thereof, but also with the magnitude of phase current; it lays a foundation for circuit hardware modelling of the switch reluctance motor system model and is beneficial for realizing direct mathematical simulation of a switch reluctance motor system. In the simulation and actual control of phase inductance nonlinear modelling of the switch reluctance motor, it is not necessary for the simulator and the controller to have great computing power, solving the conflict between cost of simulation and actual control with the instantaneity of the switch reluctance motor system; furthermore, it is beneficial to increase the accuracy for the optimization design, the quantitative analysis of the static and dynamic performance and the evaluation of control strategy of the switch reluctance motor, such that it has great theoretical value and wide application prospect.

IV. DESCRIPTION OF DRAWINGS

FIG. 1 is a view of a memory sensor model of a switch reluctance motor of the present invention.

V. EMBODIMENTS

One embodiment of the present invention is further described below in conjunction with the drawings:

As shown in FIG. 1, the modelling method for a memory sensor model of a switch reluctance motor in the present invention is as follows:

a) two current conveyors AD844, an operational amplifier AD826 and a memory resistor are utilized, wherein the terminal voltage of the input ports A-B of the memory sensor is $U_1$, and the current flowing into the memory sensor from the input port A thereof is $i_1$;

b) the input port A of the memory sensor is connected with an in-phase input port 3 of the current conveyor AD844-1 that is in turn connected with a port 5 of the current conveyor AD844-2; an out-phase input port 2 of the current conveyor AD844-1 is connected with one end of a resistor $R_i$, the other end of which is connected with the ground; the port 5 of the current conveyor AD844-1 is connected with one end of a capacitor $C_i$, the other end of which is connected with the ground; the out-phase input port 2 of the current conveyor AD844-2 is connected with one end of a resistor $R_x$, the other end of which is connected with the ground; the input port B of the memory sensor is connected with the ground, the output port 6 of the current conveyor AD844-1 is connected with one end of a memory resistor $R_M$, the other end of which is connected with the out-phase input port 2 of the operational amplifier AD826; $U_2$ is a voltage drop on the memory resistor, $i_2$ is a current in the memory resistor; the out-phase input port 2 of the operational amplifier AD826 is also connected with one end of a resistor $R_d$, the other end of which is connected with an output port 1 of the operational amplifier AD826; the output port 1 of the operational amplifier AD826 is also connected with an in-phase input port 3 of the current conveyor AD844-2; and the in-phase input port 3 of the operational amplifier AD826 is connected with the ground;

a memory sensor circuit model is obtained at the input ports A-B of the memory sensor, and the equivalent inductance L thereof is expressed as:

$$L = C_i R_i R_M \frac{R_x}{R_d}$$

For this memory sensor model of the switch reluctance motor in the simulation and actual control of phase inductance nonlinear modelling of the switch reluctance motor, it is not necessary for the simulator and the controller to have great computing power, resolving the conflict between cost of simulation and actual control with the instantaneity of the switch reluctance motor system; and it is beneficial to increase the accuracy for the optimization design, the quantitative analysis of the static and dynamic performance and the evaluation of control strategy of the switch reluctance motor.

The invention claimed is:

1. A modelling method for a memory sensor model of a switch reluctance motor, the method comprising:

utilizing a hardware circuit comprising two current conveyors AD844, an operational amplifier AD826, and a memory resistor that are in operable communication with each other, wherein the terminal voltage of the input ports A-B of the memory sensor is $U_1$, and the current flowing into the memory sensor from the input port A thereof is $i_1$;

connecting the input port A of the memory sensor with an in-phase input port (3) of the current conveyor AD844-1 that is in turn connected with a port (5) of the current conveyor AD844-2;

connecting an out-phase input port (2) of the current conveyor AD844-1 with one end of a resistor $R_i$, the other end of which is connected with the ground;

connecting the port (5) of the current conveyor AD844-1 with one end of a capacitor $C_i$, the other end of which is connected with the ground;

connecting the out-phase input port (2) of the current conveyor AD844-2 with one end of a resistor $R_x$, the other end of which is connected with the ground;

connecting the input port B of the memory sensor with the ground;

connecting the output port (6) of the current conveyor AD844-1 with one end of a memory resistor $R_M$, the other end of which is connected with the out-phase input port (2) of the operational amplifier AD826, wherein $U_2$ is a voltage drop on the memory resistor, and $i_2$ is a current in the memory resistor;

connecting the out-phase input port (2) of the operational amplifier AD826 with one end of a resistor $R_d$, the other end of which is connected with an output port (1) of the operational amplifier AD826;

connecting the output port (1) of the operational amplifier AD826 with an in-phase input port (3) of the current conveyor AD844-2;

connecting the in-phase input port (3) of the operational amplifier AD826 with the ground; and obtaining a memory sensor circuit model at the input ports A-B of the memory sensor, wherein the equivalent inductance L of the memory sensor circuit model is expressed as:

$$L = C_i R_i R_M \frac{R_x}{R_d}.$$

* * * * *